United States Patent [19]

Nukui

[11] Patent Number: 5,495,193

[45] Date of Patent: Feb. 27, 1996

[54] VOLTAGE TO FREQUENCY CONVERTER

[75] Inventor: Tadashi Nukui, Kanagawa, Japan

[73] Assignee: Kabushiki Kaisha Toshiba, Kawasaki, Japan

[21] Appl. No.: 398,650

[22] Filed: Mar. 3, 1995

[30] Foreign Application Priority Data

Mar. 4, 1994 [JP] Japan .................................. 6-034391

[51] Int. Cl.$^6$ ..................................................... H03C 3/00
[52] U.S. Cl. ........................................... 327/101; 341/157
[58] Field of Search ................................... 327/101, 103; 341/157

[56] References Cited

U.S. PATENT DOCUMENTS

| | | | |
|---|---|---|---|
| 3,731,190 | 5/1973 | Schwendtner ........................... | 324/142 |
| 4,942,401 | 7/1990 | Gessaman et al. ..................... | 341/157 |
| 4,947,033 | 8/1990 | Kordts et al. ........................ | 250/227.11 |
| 5,008,564 | 4/1991 | Hartwig ................................. | 327/101 |
| 5,019,936 | 5/1991 | Zylstra et al. .......................... | 327/101 |
| 5,126,743 | 6/1992 | Hobbs .................................... | 341/157 |

FOREIGN PATENT DOCUMENTS

| | | |
|---|---|---|
| 384858 | 8/1990 | European Pat. Off. . |
| 2612764 | 10/1976 | Germany . |
| 2642397 | 3/1978 | Germany . |
| 3516590 | 11/1986 | Germany . |

OTHER PUBLICATIONS

Patent Abstracts Of Japan, vol. 11, No. 275 (E–537), Sep. 5, 1987, JP–A–62 076302 (Toshiba Corp.), Apr. 8, 1987.
Patent Abstracts Of Japan, vol. 13, No. 493 (E–842), Nov. 8, 1989, JP–A–01 198114 (Toshiba Corp.), Aug. 9, 1989.

*Primary Examiner*—Margaret Rose Wambach
*Attorney, Agent, or Firm*—Oblon, Spivak, McClelland, Maier, & Neustadt

[57] ABSTRACT

A voltage to frequency converter including a first selector for receiving an input voltage and for generating an input current based on the control signal. The input current is proportional to the input voltage or an inverse polarity input voltage when the control signal designates plus, or minus integration period, respectively. The converter further includes a second selector for generating a reference current such that the reference current is on/off controlled based on the selection signal and a polarity of the reference current is determined by the control signal, and an integrator for integrating a resultant current of the input current and the reference current to obtain an integrated voltage. The integrator integrates the resultant current complementarily in a forward or in a reverse direction. The converter also includes a comparator for comparing the integrated voltage and a reference voltage to generate a comparison output signal, a selection signal generator for generating the selection signal based on the comparison output signal and the control signal, a control signal generator for generating the control signal based on the selection signal, and an output circuit for generating the selection signal as an output signal of the converter having a frequency corresponding to the input voltage.

9 Claims, 9 Drawing Sheets

VOLTAGE TO FREQUENCY CONVERTER

BACKGROUND OF THE INVENTION

1. Field of the Invention

This invention relates to a voltage to frequency converter, and more particularly to a voltage to frequency converter wherein an input voltage that is used in an electronic watt hour meter or the like is converted to a frequency corresponding to the input voltage.

2. Description of the Related Art

FIG. 7 shows a prior art example of a voltage to frequency converter that converts an input voltage to a frequency corresponding to the input voltage. FIG. 8 shows the waveforms of the various units of FIG. 7. In FIG. 7, there is provided a selector 8 that obtains a resultant current I3 of a reference current I2 and an input current I1 corresponding to an input voltage E. There is further provided an integrator 1 that obtains an integrated voltage A by integrating resultant current I3 of this selector 8. Next, there is provided a comparator 2 that compares integrated voltage A and a reference voltage AG and outputs low level when this integrated voltage A is higher than reference voltage AG and outputs high level when it is lower. There is further provided a selection signal generator 3 that has a JK flipflop which outputs a selection signal K when a pulse signal CLK changes from low level to high level. This selection signal K controls a switch SW that allows the passage of reference current I2 of selector 8 described above. There is also provided a pulse signal generator 5 for generating pulse signal CLK described above.

In such a circuit layout, when output signal K of JK flipflop 31 of selection signal generator 3 is high level at a time t0, switch SW is closed, and resultant current I3 flowing into capacitor C1 of integrator 1 becomes:

$$I3 = I1 - I2 \ (<0), \ I2 < I2$$

and integrator 1 commences integration in the plus direction. When output voltage A of integrator 1 becomes higher than reference potential AG at a time t1, output signal J of comparator 2 becomes low level. When output signal J of comparator 2 becomes low level, the inputs of JK flipflop 31 become:

J: low level k: high level (=Q output)

with the result that output signal K of JK flipflop 31 becomes low level at the rising edge of pulse signal CLK at a time t2 as shown in FIG. 8.

When output signal K of JK flipflop 31 is low level, switch SW is opened, and resultant current I3 flowing into capacitor C1 becomes:

$$I3 = I1 \ (>0)$$

and integrator 1 commences integration in the minus direction. When output voltage A of integrator 1 becomes lower than reference voltage AG at a time t3, output signal J of comparator 2 becomes high level. The inputs of JK flipflop 31 becomes:

J: high level

K: low level (=Q output)

and output signal K of JK flipflop 31 becomes high level at the rising edge of pulse signal CLK at a time t4 as shown in FIG. 8. When output signal K of JK flipflop 31 is high level, switch SW closes, and returns to the initial condition.

Thus when switch SW1 is closed, a quantity of electric charge Q1 stored in capacitor C1 of integrator 1 is:

$$Q1 = (I2 - I1) \times T1$$

In contrast, when switch SW is open, a quantity of electric charge Q2 discharged from capacitor C1 of integrator 1 is:

$$Q2 = I1 \times T2$$

Here, T1 is a time period when output signal K is high level and T2 is a time period when output signal K is low level, as shown in FIG. 8.

Thus, since the quantity of electric charge Q1 stored and the quantity of electric charge Q2 discharged are equal, we have:

$$(I2 - I1) \times T1 = I1 \times T2$$

$$I1 \times (T1 + T2) = I2 \times T1$$

$$1/(T1 + T2) = I1/(I2 \times T1)$$

T1 is given by T1=1/fCLK from a frequency fCLK of pulse signal CLK of pulse signal generator 5, and so is constant.

If the input offset voltage of an operational amplifier OP1 of integrator 1 is zero, a minus input potential of operational amplifier OP1 is reference potential AG which is usually zero volts. From a minus reference potential VSS and a resistor R2, reference current I2 is fixed at I2= VSS/R2. From a resistor R1 and input voltage E of the voltage to frequency converter, input current I1 is obtained as I1=E/R1. As a result, an output frequency f of the voltage to frequency converter obtained at an output terminal Tout on substitution in the foregoing expression, is as follows:

$$\begin{aligned} f &= 1/(T1 + T2) \\ &= I1/(I2 \times T1) = (E \times R2 \times fCLK)/(VSS \times R1). \end{aligned}$$

Thus, output frequency f has a value proportional to input voltage E.

Although, in the above explanation, it is assumed that the input offset voltage of operational amplifier OP1 is zero, usually the input offset voltage has a value V. In this case, minus input potential of operational amplifier OP1 is V. An output frequency fE of the voltage to frequency converter in this case is then obtained by the following expression:

$$\begin{aligned} fE &= 1/(T1 + T2) \\ &= \{(E - V) \times R2 \times fCLK\}/\{(VSS + V) \times R1\} \end{aligned}$$

In this case, the linearity of input voltage E and output frequency fE of the voltage to frequency converter is poor. The relation between an linear error ERR and input voltage E when operational amplifier OP1 has an input offset voltage V is given by the following expression, and has the characteristic shown in FIG. 9.

$$ERR = (fE - f) \times 100/f \ [\%]$$

SUMMARY OF THE INVENTION

Accordingly, one object of this invention is to provide a voltage to frequency converter for converting an input voltage to a frequency corresponding to the input voltage, wherein the linearity error is extremely small even if the operational amplifier of the integrator has an input offset voltage.

These and other objects of this invention is achieved by providing a voltage to frequency converter including a fist selector for receiving an input voltage and a control signal determining a plus integration period and a minus integration period and for generating an input current based on the control signal such that the input current is proportional to the input voltage when the control signal designates the plus integration period and the input current is proportional to an inverse polarity input voltage whose polarity is an inverse of that of the input voltage when the control signal designates the minus integration period. The voltage to frequency converter further includes a second selector connected to receive the control signal and a selection signal for generating a reference current such that the reference current is on/off controlled based on the selection signal and a polarity of the reference current is determined by the control signal, and an integrator for integrating a resultant current of the input current and the reference current to obtain an integrated voltage. The integrator integrates the resultant current complementarily in a forward direction and in a reverse direction in accordance with a polarity of the selection signal during one of the plus integration period and the minus integration period, respectively. The voltage to frequency converter also includes a comparator for comparing the integrated voltage and a reference voltage to generate a comparison output signal, a selection signal generator for generating the selection signal based on the comparison output signal and the control signal, a control signal generator connected to receive the selection signal for generating the control signal determining the plus integration period and the minus integration period based on the selection signal, and an output circuit for generating the selection signal as an output signal of the voltage to frequency converter having a frequency corresponding to the input voltage.

The charge of a resultant current produced by an input voltage and a minus reference voltage is discharged by an input current caused by the input voltage (plus integration period); the charge of a resultant current produced by an inverse polarity input voltage and a plus reference voltage is discharged, by an input current caused by the inverse-polarity input voltage (minus integration period). This plus integration period and minus integration period are repeated a prescribed number of times, in complementary fashion. Since the times required for these charging and discharging processes are directly proportional respective to the input voltage and the inverse-polarity input voltage, the output period of selection signal K obtained by repetition of this operation is directly proportional to the input voltage. By adoption of such means, both the input voltage and the inverse-polarity input voltage can be converted to corresponding frequencies so, even when the operational amplifier of the integrator has an input offset voltage, the linearity error can be made extremely small.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
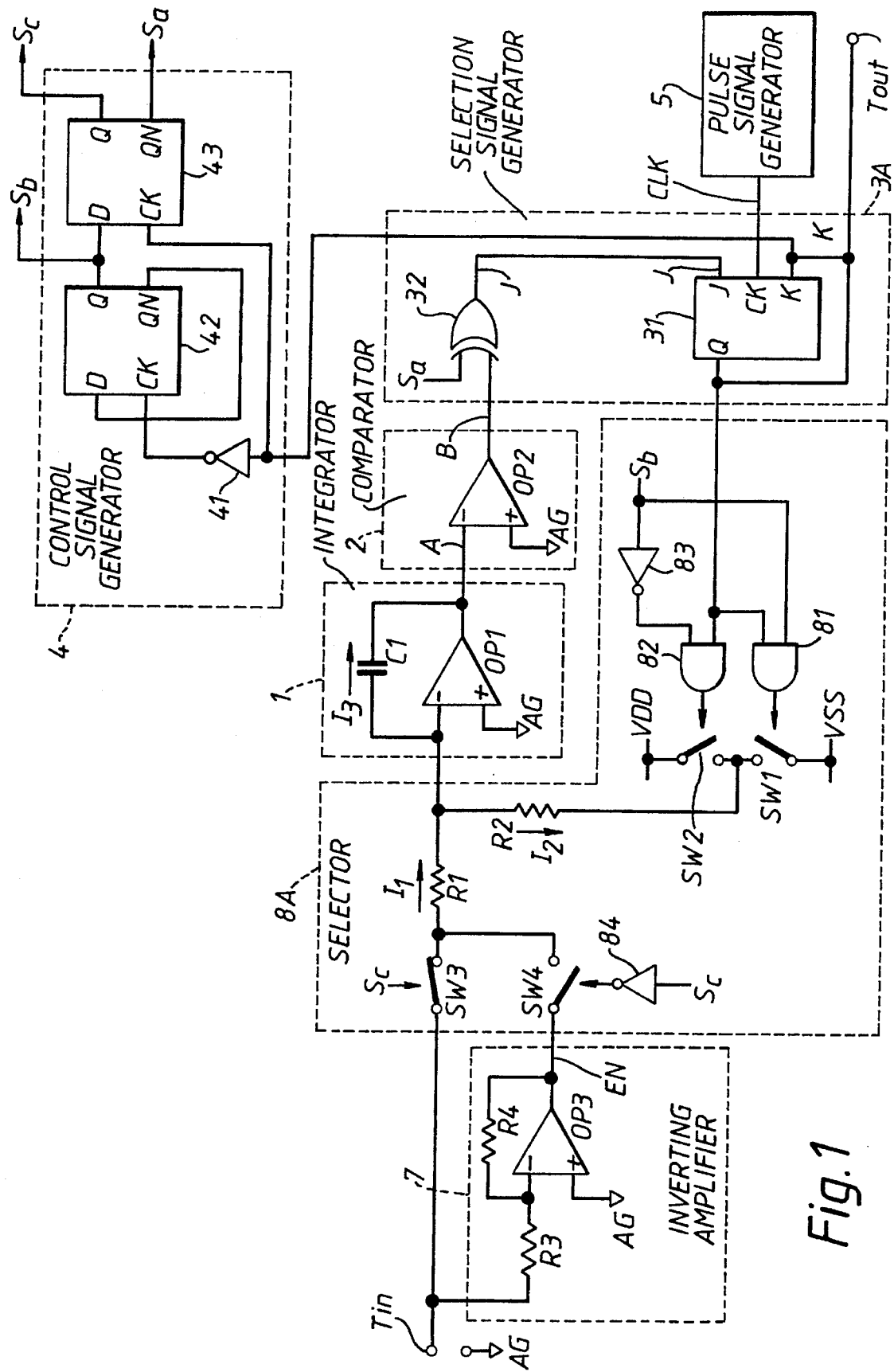
FIG. 1 is a circuit diagram showing a voltage to frequency converter according to an embodiment of this invention.

Referring now to the drawings, wherein like reference numerals designate identical or corresponding parts throughout the several views, the embodiments of this invention will be described below.

FIG. 1 is a circuit diagram showing a voltage to frequency converter according to an embodiment of this invention. In FIG. 1, Tin is a voltage input terminal at which input voltage E to be converted into frequency is applied.

Integrator 1 outputs integrated voltage A obtained by integrating the current that is supplied from selector 8A and is constituted of operational amplifier OP1 and capacitor C1. Comparator 2 compares output voltage A of integrator 1 with reference voltage AG and outputs signal B which is of low level when output voltage A of integrator 1 is higher than reference potential AG and is of high level when it is lower than reference potential AG.

A selection signal generator 3A is constituted of an XOR gate 32 and JK flipflop 31. XOR gate 32 functions as a non-coincidence detector that detects and outputs non-coincidence of output signal B of comparator 2 with a control signal Sa from a control signal generator 4, to be described. JK flipflop 31 is a JK flipflop whose input signals are respectively: output signal J of non-coincidence detector 32, at an input terminal J; pulse signal CLK from pulse signal generator 5 at an input terminal CK; and output signal K of an output terminal Q at an input terminal K. JK flipflop 31 outputs selection signal K when pulse signal CLK has changed from low level to high level.

Control signal generator 4 is a circuit that inputs output signal K of JK flipflop 31 of selection signal generator 3A, and generates control signals Sa, Sb and Sc. Control signal generator 4 is constituted of: an inverter 41 for inverting output signal K of selection signal generator 3A; a D flipflop 42 that inputs at an input terminal CK an output signal of inverter 41 and whose output terminal QN is connected to an input terminal D; and a D flipflop 43, whose input signals are respectively an output signal Sb of D flipflop 42 at an input terminal D and output signal K of selection signal generator 3A at an input terminal CK. Control signals Sa, Sb and Sc are generated at an output terminal QN of D flipflop 43, at an output terminal Q of D flipflop 42, and at an output terminal Q of D flipflop 43, respectively.

7 is an inverting amplifier that generates an inverse-polarity input voltage EN obtained by inverting the polarity of input voltage E that is input from voltage input terminal Tin. Inverting amplifier 7 is constituted by an operational amplifier OP3 and resistors R3 and R4.

Figure 7:
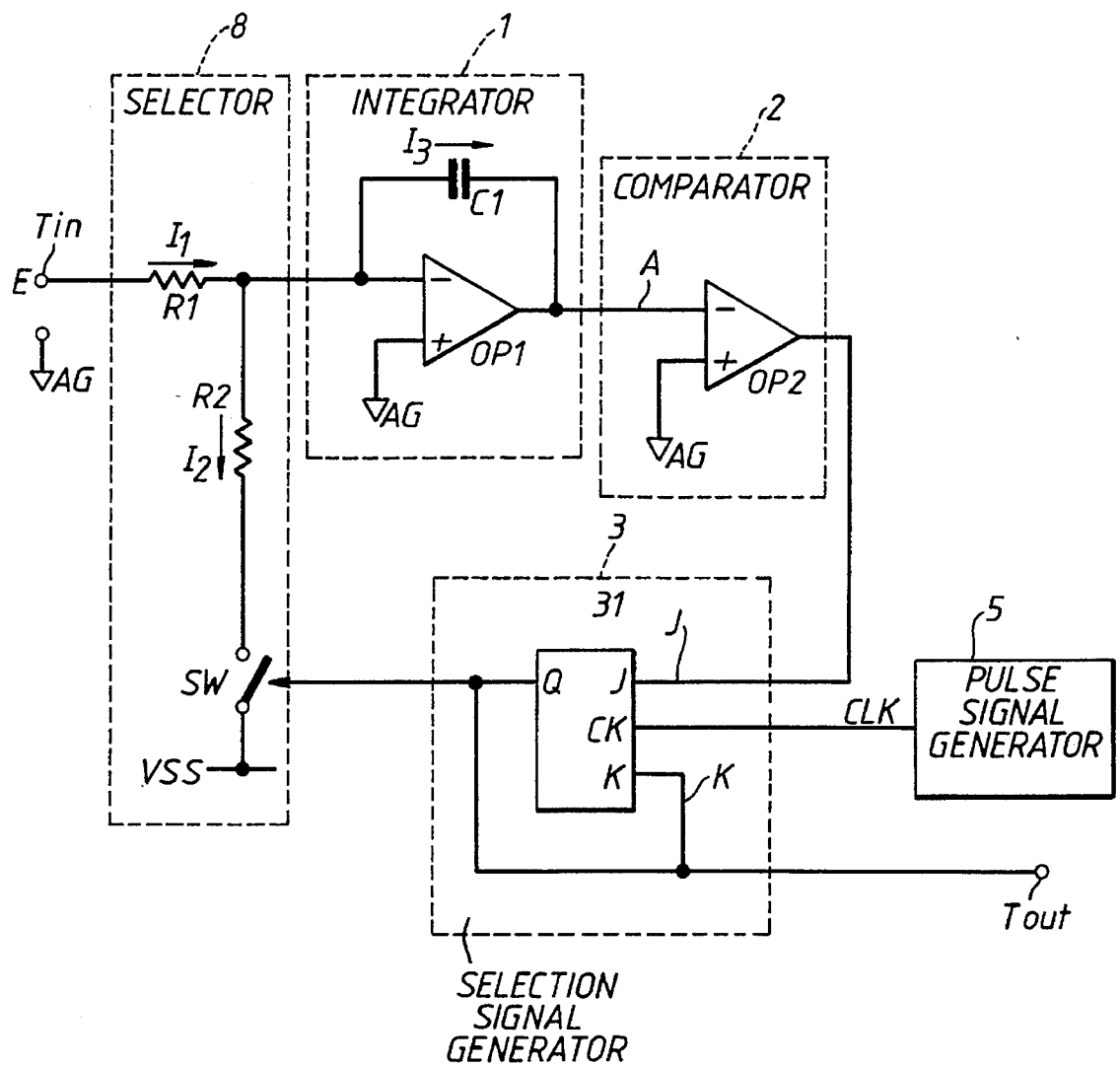
FIG. 7 is a circuit diagram showing one example of a conventional voltage to frequency converter.
Figure 8:
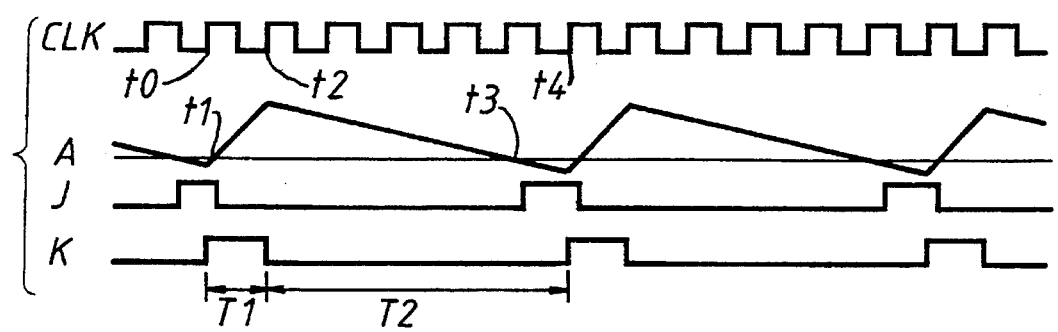
FIG. 8 is a time chart of the waveforms of the various parts of the device shown in FIG. 7.
Figure 9:
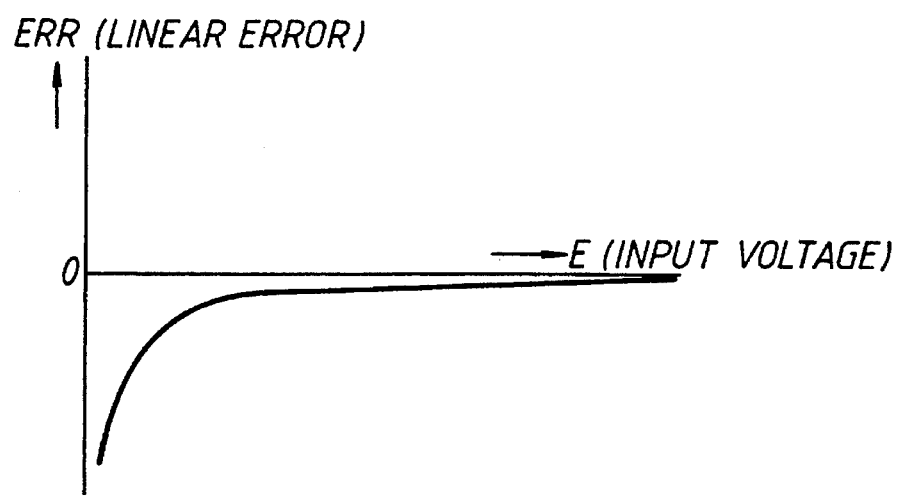
FIG. 9 is a graph showing characteristic plot of linearity error in the device shown in FIG. 7.

Unlike selector 8 in FIG. 7, selector 8A generates input current I1 by obtaining as input, changed over in a complementary fashion, input voltage E at voltage input terminal Tin and inverse-polarity input voltage EN, which is the output of the inverting amplifier 7, under the control of control signal Sc from control signal generator 4. Selector 8A also generates reference current I2 by connecting either a plus reference voltage VDD or minus reference voltage VSS, as specified by selection signal K from selection signal generator 3A and control signal Sb from control signal generator 4. Selector 8A also supplies resultant current I3 of input current I1 and reference current I2 to integrator 1.

Selector 8A is constituted of: an inverter 83 whose input signal is control signal Sb; an AND gate 81 whose input signals are control signals Sb and selection signal K; an AND gate 82 whose input signals are the output signal of inverter 83 and selection signal K; a switch SW1 that is closed or open when the output signal of AND gate 81 is high level or low level; a switch SW2 that is closed or open when the output signal of AND gate 82 is high level or low level; an inverter 84 whose input signal is control signal Sc; a switch SW3 that is closed or open when control signals Sc is high level or low level; a switch SW4 that is closed or open when the output signal of inverter 84 is high level or low level; and resistors R1, R2. Pulse signal generator 5 generates pulse signal CLK with a prescribed period, and is constituted by a crystal oscillator or the like.

Next, the operation of the voltage to frequency converter with the circuitry constituted as shown in FIG.1 will be described with reference to the time chart of the waveforms of the various units shown in FIG. 2. Here, the interval for which control signals Sc of control signal generator 4 is high level will be called "a plus integration period", while the interval for which control signals Sc is low level will be called "a minus integration period".

In the plus integration period, control signals Sc is high level, so switch SW3 of selector 8A is closed, and input voltage E is applied to resistor R1. Furthermore, when output signal K of JK flipflop 31 of selection signal generator 3A is high level, control signal Sb which is the output of D flipflop 42 is high level, so switch SW1 is closed by the output of AND gate 81 in selector 8A. Consequently, minus reference voltage VSS is connected to resistor R2.

As a result, current I3 flowing into capacitor C1 of integrator 1 is:

$$I3=I1-I2 \ (<0), \ I1<I2$$

and integrator 1 commences integration in the plus direction after a time t5.

When output voltage A of integrator 1 is higher than reference potential AG, output signal B of comparator 2 is low level. When output signal B of comparator 2 is low level, control signal Sa becomes low level, so output signal J of non-coincidence detector 32 becomes low level. As output signal K keeps high level, the inputs of JK flipflop 31 become:

J: low level

K: high level (=Q output)

Thus output signal K of JK flipflop 31 becomes low level at the rising edge of pulse signal CLK at a time t6. When output signal K of JK flipflop 31 becomes low level, switch SW1 is opened. As switch SW2 keeps the open state current I3 flowing into capacitor C1 of integrator 1 becomes:

$$I3=I1 \ (>0)$$

so integrator 1 commences integration in the minus direction after time t6.

In the plus integration period, $$I1=E/R1$$

$$I2=VSS/R2$$

Consequently, an output frequency fp of the voltage to frequency converter obtained at output terminal Tout in the plus integration period is given by the following expression:

$$fp=1/(T1+T2)=(E \times R2 \times fCLK)/(VSS \times R1)$$

Figure 2:
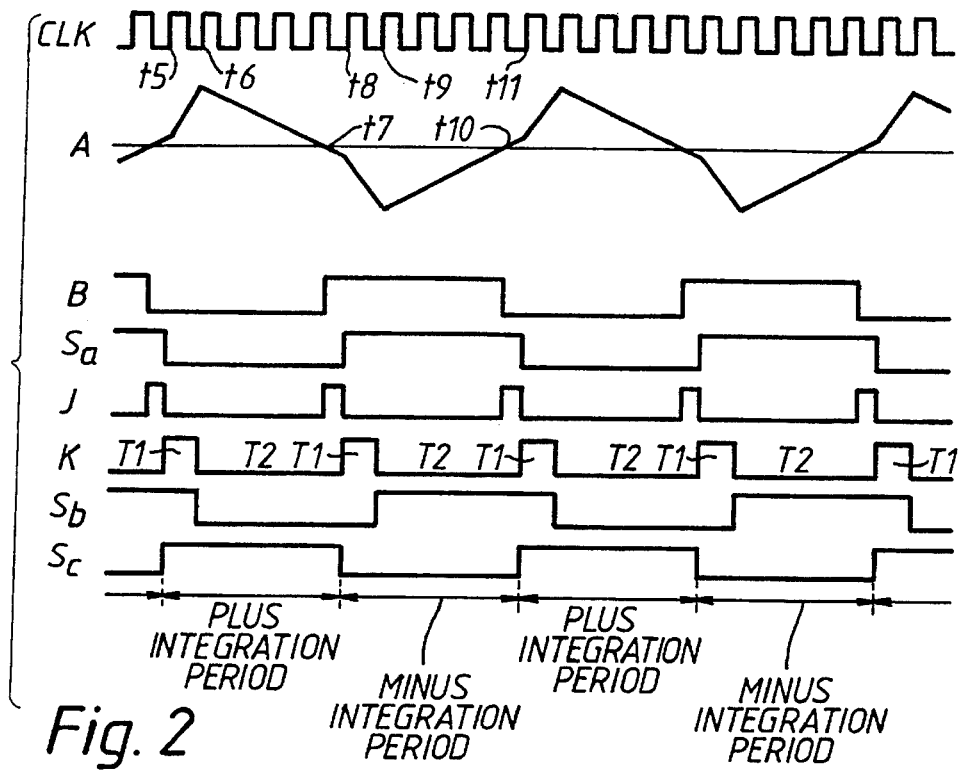
FIG. 2 is a time chart of the waveforms of the various parts of the embodiment shown in FIG. 1.

Here T1 is a time period when output signal K is high level and T2 is a time period when output signal K is low level, as shown in FIG. 2.

When output voltage A of integrator 1 becomes lower than reference potential AG at a time t7, output signal B of comparator 2 becomes high level. When output signal B of comparator 2 becomes high level, as control signal Sa is low level, so output signal J of non-coincidence detector 32 becomes high level. As output signal K keeps low level, the inputs of JK flipflop 31 become:

J: high level

K: low level (=Q output)

Thus output signal K of JK flipflop 31 becomes high level at the leading edge of pulse signal CLK at a time t8. At this point, control signal Sc changes from high level to low level, thereby shifting to the minus integration period.

In the minus integration period, control signal Sc is low level, so switch SW4 is closed, and inverse-polarity input voltage EN obtained by inverting the polarity of input voltage E in inverting amplifier 7 is applied to resistor R1. When output signal K of JK flipflop 31 is high level, control signal Sb is low level, so switch SW2 is closed by the output of AND gate 82 in selector 8A. Consequently, plus reference potential VDD is connected to resistor R2. As a result, current I3 that flows into capacitor C1 of integration 1 is:

$$I3=I1-I2 \ (>0) \ I1>I2$$

so integrator 1 commences another integration in the minus direction after time t8. When output voltage A of integrator 1 is lower than reference potential AG, output signal B of comparator 2 is high level. When output signal B of comparator 2 is high level, control signal Sa becomes high level, so output signal J of non-coincidence detector 32 becomes low level. As output signal K keeps high level, the inputs of JK flipflop 31 becomes:

J: Low level

K: high level (=Q output)

Thus output signal K of JK flipflop 31 becomes low level at the leading edge of pulse signal CLK at a time t9. When output signal K of JK flipflop 31 becomes low level, switch SW2 is opened. As switch SW1 keeps the open state, current I3 flowing into capacitor C1 of integrator 1 becomes:

$$I3=I1 \ (>0)$$

so integrator 1 commences integration in the plus direction after time t9.
In the minus integration period, $$I1=EN/R1=-E/R1$$

$$I2=VDD/R2=-VSS/R2$$

Here, the absolute values of negative reference potential VSS and positive reference potential VDD are usually set to be equal to each other.

Consequently, an output frequency fm of the voltage to frequency converter obtained at output terminal Tout in the minus integration period is given by the following expression:

$$fm=1/(T1+T2)=(-E\times R2\times fCLK)/(-VSS\times R1)$$

when output voltage A of integrator 1 gets higher than reference potential AG at a time t10, output signal B of comparator 2 becomes low level. When output signal B of comparator 2 becomes low level, as control signal Sa is high level, so the output signal J of non-coincidence detector 32 becomes high level. As output signal K keeps low level the inputs of JK flipflop 31 become:

J: high level
K: low level (=Q output)

Thus output signal K of JK flipflop 31 becomes high level at the leading edge of pulse signal CLK at a time t11. At this point, control signal Sc changes from low level to high level, so there is a shift to the plus integration period.

The mean output frequency f of the voltage to frequency converter as obtained by complementary changeover between the plus integration period and minus integration period as described above is then given by the following expression:

$$\begin{aligned}f &= (fp+fm)/2\\ &= \{(E\times R2)/(VSS\times R1)+(-E\times R2)/\\ &\quad (-VSS\times R1)\}\times fCLK/2\\ &= (E\times R2\times fCLK)/(VSS\times R1)\end{aligned}$$

As a result, a frequency f that is directly proportional to input voltage E is obtained.

Now let us consider the case where operational amplifier OP1 of integrator 1 has an input offset voltage V. In this case, input potential at minus input terminal of operational amplifier OP1 is voltage V. Output frequency fE of the voltage to frequency converter in this case is then given by the following expression:

$$\begin{aligned}fE &= \{[(E-V)\times R2]/[(VSS+V)\times R1]+\\ &\quad [(-E-V)\times R2]/[(-VSS+V)\times R1]\}\times fCLK/2\\ &= (E\times VSS+V^2)/(VSS^2-V^2)\times (R2)/(R1)\times fCLK\end{aligned}$$

As can be seen from this expression, by making minus reference potential VSS, and plus reference potential VDD equally, sufficiently greater than input offset voltage V of operational amplifier OP1, the effect of input offset voltage V on output frequency f of the voltage to frequency converter can be made small.

Thus, with this embodiment, inverse-polarity input voltage EN obtained by inverting the polarity of input voltage E can be converted to a corresponding frequency fm, similarly, so even if operational amplifier OP1 of integrator 1 has input offset voltage V, an accurate voltage to frequency converter can be obtained which has extremely small linearity error.

Figure 3:
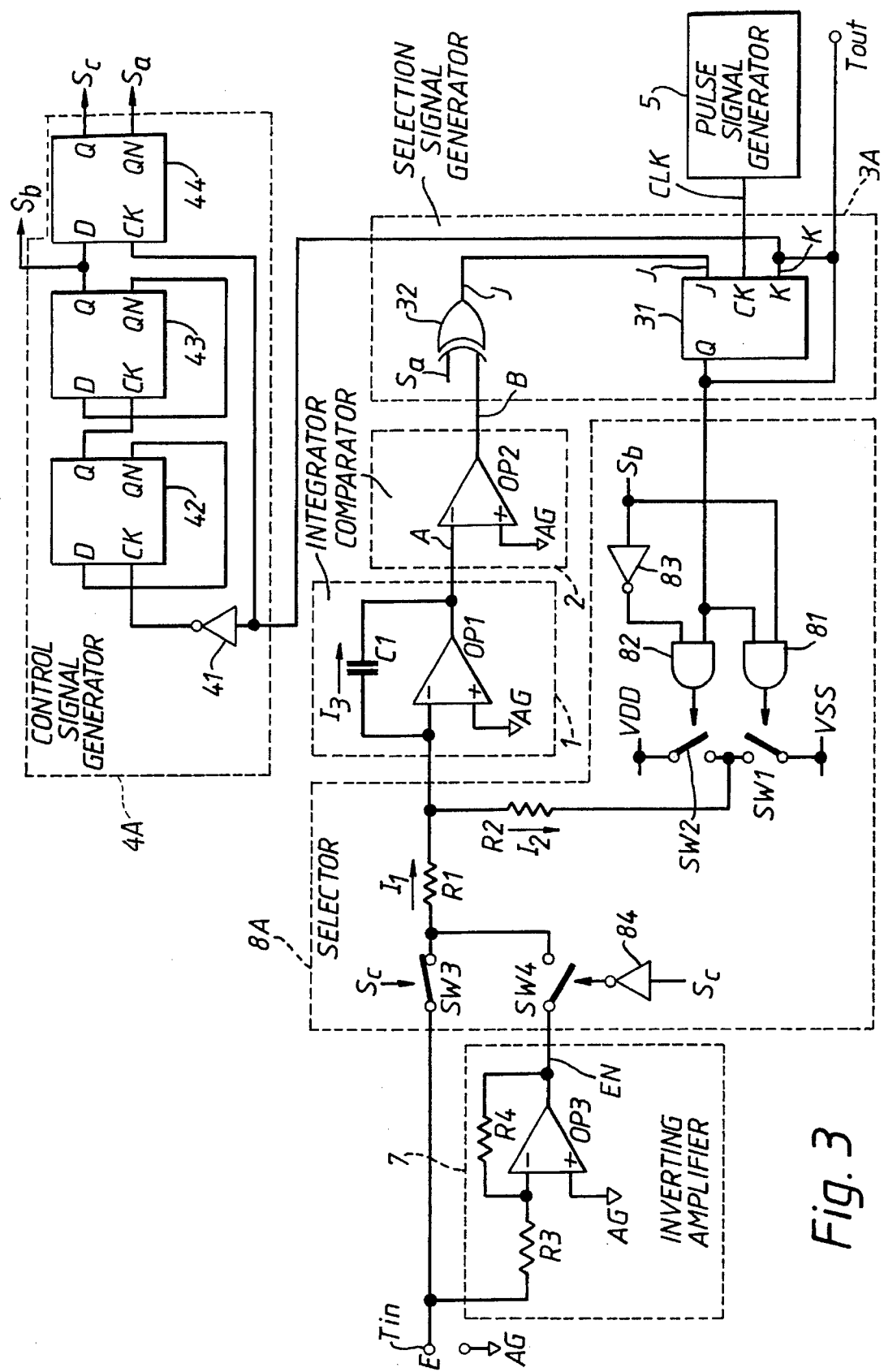
FIG. 3 is a circuit diagram showing a voltage to frequency converter according to another embodiment of this invention.
Figure 4:
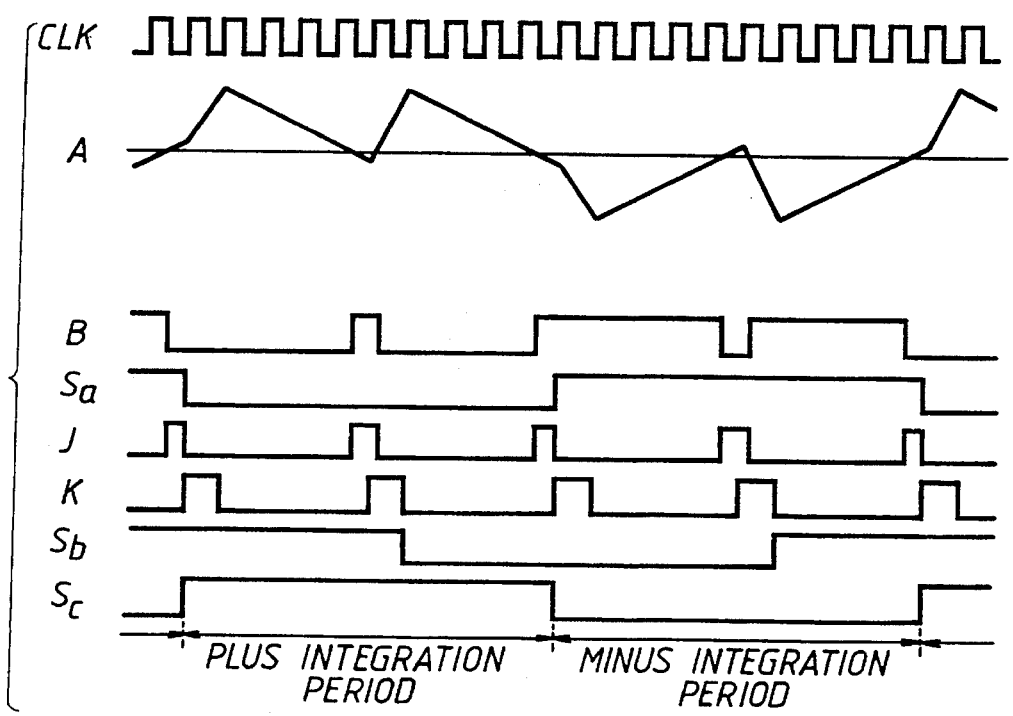
FIG. 4 is a time chart of the waveforms of the various parts of the embodiment shown in FIG. 3.

In the embodiment shown in FIG. 1 and FIG. 2, the plus integration period and minus integration period were changed over every time one pulse was output by signal K, by providing D flipflops 42 and 43 in control signal generator 4. However, this invention is not limited to this embodiment. FIG. 3 and FIG. 4 show a voltage to frequency converter according to another embodiment of this invention, in which the plus integration period and minus integration period are changed over every time two pulses are output by signal K, by providing D flipflops 42, 43 and 44 in control signal generator 4A.

Figure 5:
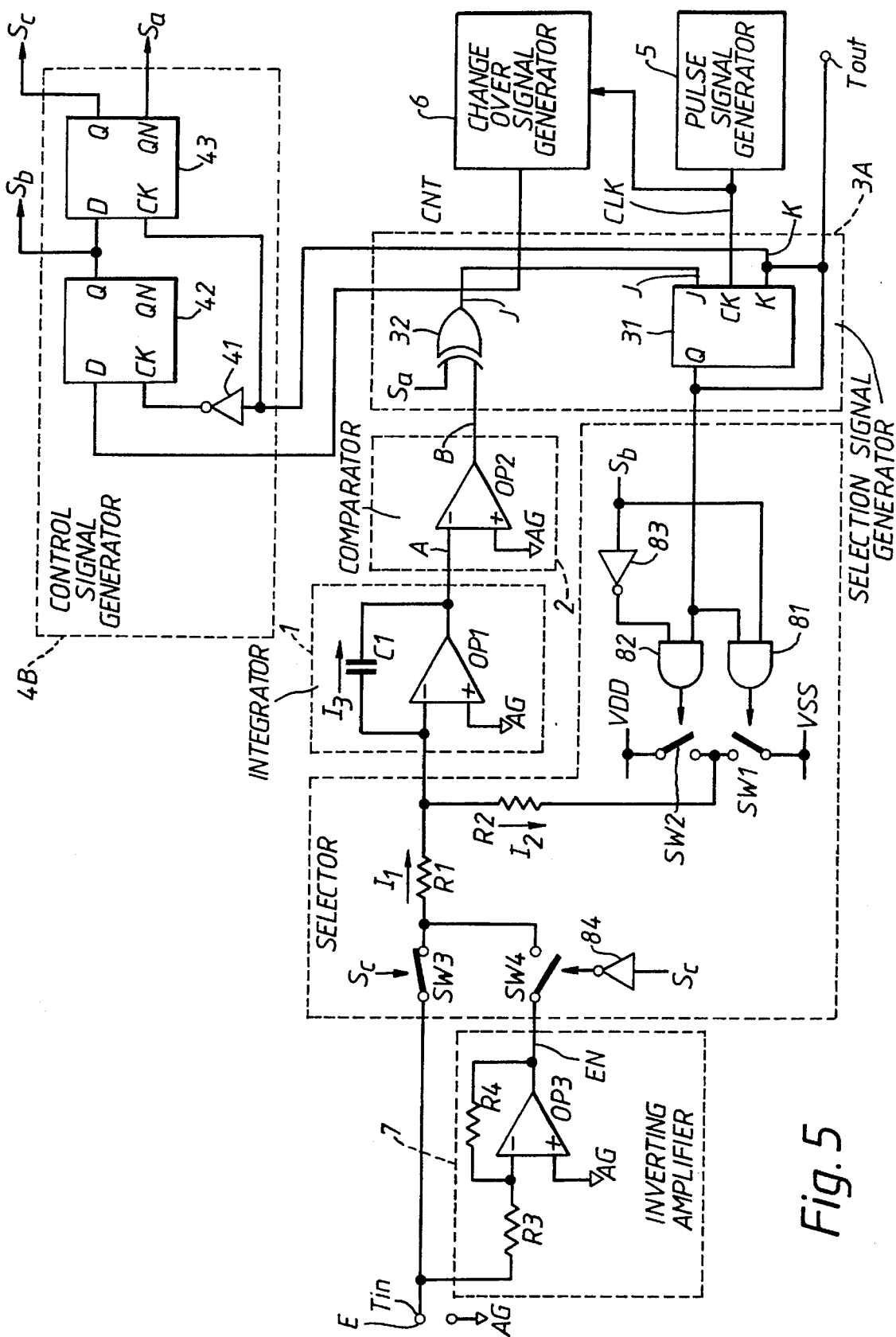
FIG. 5 is a circuit diagram showing a voltage to frequency converter according to a further embodiment of this invention.
Figure 6:
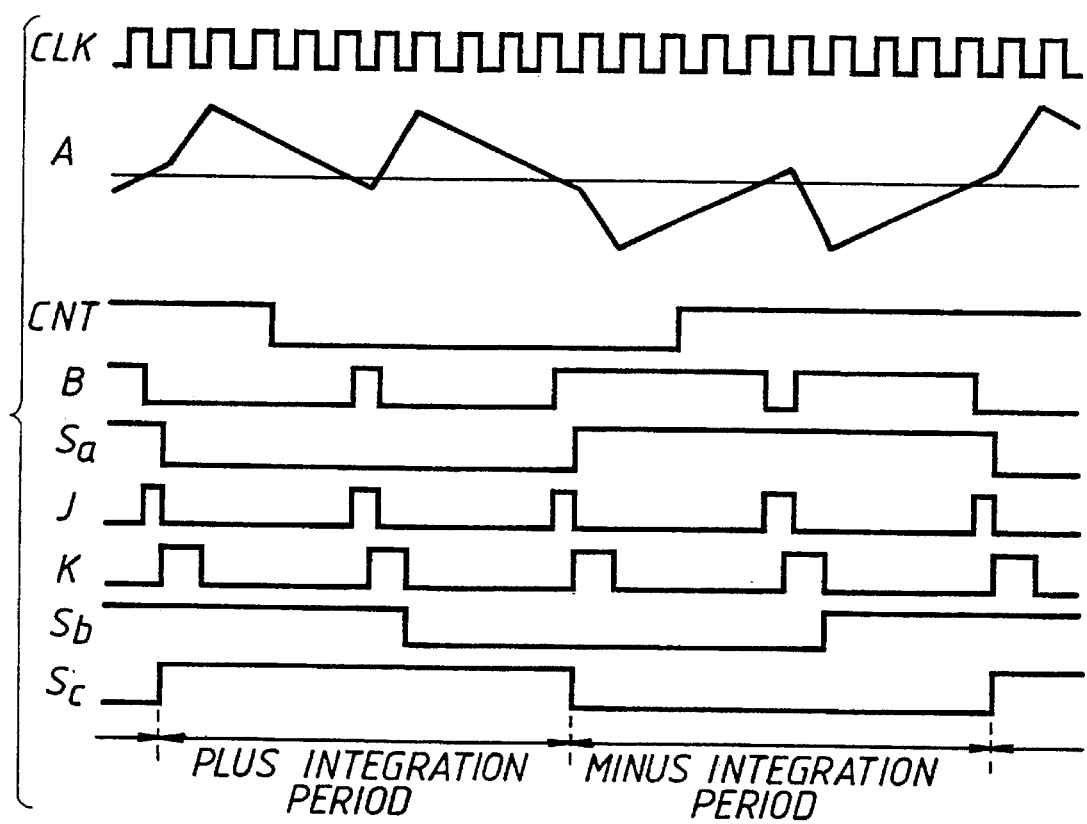
FIG. 6 is a time chart of the waveforms of the various parts of the embodiment shown in FIG.

Yet a voltage to frequency converter according to a further embodiment of this invention is shown in FIG. 5 and FIG. 6. In the circuit shown in FIG. 5, a changeover signal generator 6 generates a changeover signal CNT with a prescribed period, and is constituted by a frequency divider or the like that outputs high level signal and low level signal alternately every time pulse signal CLK is input a prescribed number of times. Changeover signal CNT is applied to D input of D flipflop 42 of a control signal generator 4B.

Control signal generator 4B for generating control signals Sa, Sb, Sc is constituted of: inverter 41 whose input signal is output signal K of selection signal generator 3A; D flipflop 42 whose input signals are respectively output signal CNT of changeover signal generator 6 at input terminal D and output signal of inverter 41 at input terminal CK; and D flipflop 43 whose input signals are respectively output signal Sb of D flipflop 42 at input terminal D, and output signal K of selection signal generator 3A at input terminal CK.

In this embodiment, the plus integrating period and minus integrating period are changed over alternately at prescribed time intervals, so the same benefit as the embodiment shown in FIG. 1 can be obtained.

In these three embodiments described above, if inverted polarity input voltage EN obtained by inverting the polarity of input voltage E is input, along with input voltage E to voltage to frequency converter inverting amplifier 7 is not needed.

In these three embodiments, control signal Sb is applied to the inputs of inverter 83 and AND gate 81 of selector 8A. But this invention is not limited to these embodiments. There can be provided other embodiments wherein control signal Sc in place of control signal Sb is applied to the inputs of inverter 83 and AND gate 81 in these embodiments.

Figure 10:
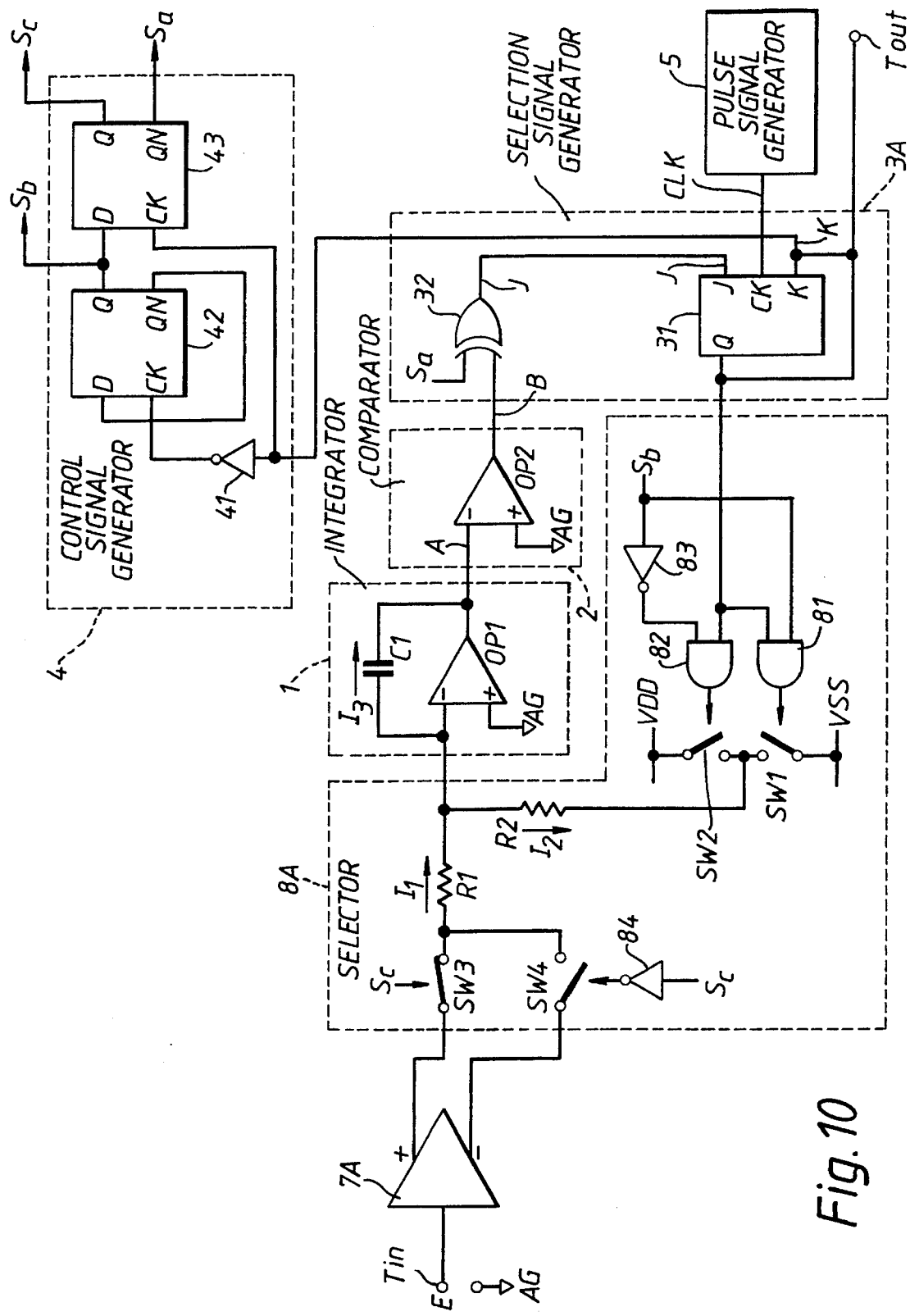
FIG. 10 is a circuit diagram showing a voltage to frequency converter according to another embodiment of this invention.

In these three embodiments, inverting amplifier 7 is used to obtain inverse-polarity input voltage EN. But, there can be provided other embodiments wherein a differential difference amplifier is used in place of inverting amplifier 7. One of these embodiments corresponding to the embodiment of FIG. 1 is shown in FIG. 10. In FIG. 10, 7A is a differential difference amplifier which generates a voltage corresponding to input voltage E at a plus output terminal and a voltage corresponding to inverse-polarity input voltage EN at a minus output terminal. These voltages are applied to switches SW3 and SW4, respectively.

Figure 11:
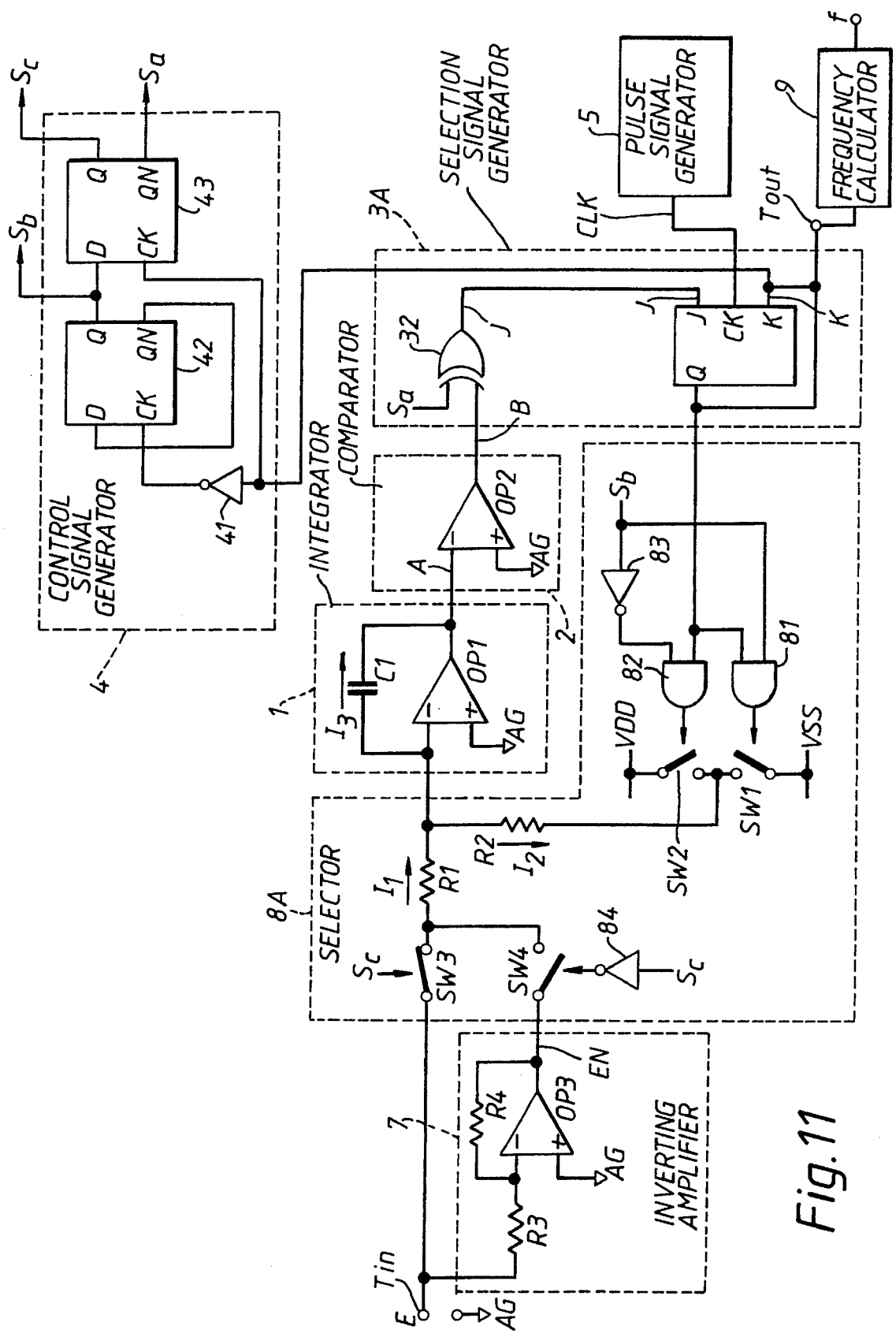
FIG. 11 is a circuit diagram showing a voltage to frequency converter according to still another embodiment of this invention.

Another embodiment of this invention is shown in FIG. 11 in which a frequency calculator 9 is further provided. Frequency calculator 9 inputs selection signal K and calculates mean output frequency f as in the following expression based on selection signal K, thereby to output mean output frequency f corresponding to input voltage E as an output of voltage to frequency converter.

$$f=(fp+fm)/2$$

As described above, with this invention, even if an operating amplifier of an integrator has an offset voltage, the voltage signals are input in complementary fashion in plus and minus integration periods respectively, so the offset can be eliminated. A voltage to frequency converter of high accuracy and with very little linearity error can thereby be obtained.

Obviously, numerous modifications and variations of the present invention are possible in light of the above teachings. It is therefore to be understood that within the scope of the appended claims, the invention may be practiced otherwise than as specifically described herein.

What is claimed is:

1. A voltage to frequency converter, comprising:

first selector means for receiving an input voltage and a control signal determining a plus integration period and a minus integration period and for generating an input current based on said control signal such that said input current is proportional to said input voltage when said control signal designates said plus integration period and said input current is proportional to an inverse polarity input voltage whose polarity is an inverse of that of said input voltage when said control signal designates said minus integration period;

second selector means connected to receive said control signal and a selection signal for generating a reference current such that said reference current is on/off controlled based on said selection signal and a polarity of said reference current is determined by said control signal;

integrator means for integrating a resultant current of said input current and said reference current to obtain an integrated voltage, said integrator means integrating said resultant current complementarily in a forward direction and in a reverse direction in accordance with a polarity of said selection signal during one of said plus integration period and said minus integration period, respectively;

comparator means for comparing said integrated voltage and a reference voltage to generate a comparison output signal;

selection signal generator means for generating said selection signal based on said comparison output signal and said control signal;

control signal generator means connected to receive said selection signal for generating said control signal determining said plus integration period and said minus integration period based on said selection signal; end output means for generating said selection signal as an output signal of said voltage to frequency converter having a frequency corresponding to said input voltage.

2. The voltage to frequency converter according to claim 1:

wherein said selection signal generator means generates said selection signal composed of a first selection signal having a first frequency of said input voltage when said control signal designates said plus integration period and a second selection signal having a second frequency of said inverse polarity input signal when said control signal designates said minus integration period; and further comprising frequency calculator means connected to receive said selection signal for calculating a mean frequency based on said first frequency and said second frequency of said selection signal.

3. The voltage to frequency converter according to claim 1:

wherein said first selector means includes an inverting amplifier connected to receive said input voltage for inverting a polarity of said input voltage to obtain said inverse polarity input voltage.

4. The voltage to frequency converter according to claim 1:

wherein said first selector means includes a differential difference amplifier connected to receive said input voltage for generating said input voltage and said inverse polarity input voltage.

5. The voltage to frequency converter according to claim 1:

wherein said first selector means receives said inverse polarity input voltage from outside of said voltage to frequency converter.

6. The voltage to frequency converter according to claim 1, wherein:

said first selector means includes a third switch controlled by said control signal, a fourth switch controlled by said control signal and a first resistor;

said input voltage is applied to a first terminal of said third switch;

said inverse polarity input voltage is applied to a first terminal of said fourth switch;

second terminals of said third switch and said fourth switch are commonly connected to a first terminal of said first resistor;

a second terminal of said first resistor is connected to an output terminal of said first selector means;

said third switch is closed when said control signal designates said plus integration period to flow said input current proportional to said input voltage through said first resistor from said output terminal of said first selector means; and said fourth switch is closed when said control signal designates said minus integration period to flow said input current proportional to said inverse polarity input voltage through said first resistor from said output terminal of said first selector means.

7. The voltage to frequency converter according to claim 1, wherein:

said second selector means includes a first switch controlled by said control signal and said selection signal, a second switch controlled by said control signal and said selection signal and a second resistor;

a first terminal of said first switch is connected to a minus reference potential;

a first terminal of said second switch is connected to a plus reference potential;

second terminals of said first switch and said second switch are commonly connected to a first terminal of said second resistor;

a second terminal of said second resistor is connected to an output terminal of said second selector means:

said first switch is closed when said control signal designates said plus integration period and said selection signal is applied to flow said reference current of a first polarity through said second resistor from said output terminal of said second selector means; and said second switch is closed when said control signal designates said minus integration period and said selection signal is applied to flow said reference current of a second polarity which is an inverse of said first polarity through said second resistor from said output terminal of said second selector means.

8. The voltage to frequency converter according to claim 1, further comprising:

pulse signal generator means for generating a pulse signal having a first predetermined period;

wherein said selection signal generator means generates said selection signal at a timing of change of said pulse signal immediately after a change of said comparison output signal during when said control signal is in a prescribed condition.

9. The voltage to frequency converter according to claim 1, further comprising:

pulse signal generator means for generating a pulse signal having a first predetermined period; and changeover signal generator means for generating a changeover signal having a second predetermined period;

wherein said selection signal generator means generates said selection signal at a timing of change of said pulse signal immediately after a change of said comparison output signal during when said control signal is in a prescribed condition; and wherein said control signal generator means is further connected to receive said changeover signal and generates said control signal at a timing determined by said second predetermined period of said changeover signal.

* * * * *